United States Patent
Tsai

(10) Patent No.: US 9,673,832 B2
(45) Date of Patent: Jun. 6, 2017

(54) SUCCESSIVE APPROXIMATION ANALOG-TO-DIGITAL CONVERTER AND ACCURACY IMPROVING METHOD THEREOF

(71) Applicant: MediaTek Inc., Hsin-Chu (TW)

(72) Inventor: Chihhou Tsai, New Taipei (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/134,866

(22) Filed: Apr. 21, 2016

(65) Prior Publication Data

US 2016/0336954 A1 Nov. 17, 2016

Related U.S. Application Data

(60) Provisional application No. 62/162,237, filed on May 15, 2015.

(51) Int. Cl.
*H03M 1/38* (2006.01)
*H03M 1/08* (2006.01)
(Continued)

(52) U.S. Cl.
CPC ........... *H03M 1/08* (2013.01); *H03M 1/0636* (2013.01); *H03M 1/462* (2013.01); *H03M 1/468* (2013.01)

(58) Field of Classification Search
CPC ........ H03M 1/462; H03M 1/468; H03M 1/38; H03M 1/403; H03M 1/1033; H03M 1/002;
(Continued)

(56) References Cited

U.S. PATENT DOCUMENTS 4,970,514 A * 11/1990 Draxelmayr ........ H03M 1/1042
324/130
8,222,927 B2 * 7/2012 Liao ........................ G05F 1/56
327/108
(Continued)

OTHER PUBLICATIONS

Giannini, V., et al.; "An 820 µW 9b 40MS/s Noise Tolerant Dynamic SAR ADC in 90nm Digital CMOS;" ISSCC 2008; Session 12; High-Efficiency Data Converters; IEEE International Solid-State Circuits Conference; 2008; pp. 238-240.
(Continued)

*Primary Examiner* — Lam T Mai
(74) *Attorney, Agent, or Firm* — McClure, Qualey & Rodack, LLP

(57) ABSTRACT

A successive approximation register analog-to-digital converter (SAR ADC) with high accuracy is disclosed. Within the SAR ADC, a SAR logic circuit combines the output signal of a comparator collected during at least two successive cycles of a plurality of cycles of a search scheme of digital representation of an analog input and, accordingly, makes a one-step control for a voltage difference between a positive and a negative input terminal of the comparator. At least three capacitor network switching choices for a capacitor network of the SAR ADC are provided by the one-step control. By the one-step control, a selection between the at least three capacitor network switching choices is made according to at least two comparison results of the comparator obtained during the at least two successive cycles. In this manner, comparator noise is utilized as an additional quantization level to improve the overall ADC noise performance.

31 Claims, 7 Drawing Sheets

(51) Int. Cl.
  *H03M 1/06*  (2006.01)
  *H03M 1/46*  (2006.01)
(58) Field of Classification Search
  CPC .... H03M 1/466; H03M 1/804; H03M 1/1061;
                      H03M 1/662; H03M 1/124
  USPC ................................................ 341/155–165
  See application file for complete search history.

(56) References Cited

U.S. PATENT DOCUMENTS

| | | | | |
|---|---|---|---|---|
| 8,669,896 | B2* | 3/2014 | Tsai | H03M 1/462 |
| | | | | 341/155 |
| 8,902,093 | B1* | 12/2014 | Leuciuc | H03M 1/1245 |
| | | | | 341/118 |
| 2004/0227652 | A1* | 11/2004 | Draxelmayr | H03M 1/1033 |
| | | | | 341/120 |
| 2007/0001892 | A1* | 1/2007 | Kuttner | H03M 1/403 |
| | | | | 341/161 |
| 2010/0156684 | A1* | 6/2010 | Westwick | H03M 1/0636 |
| | | | | 341/131 |
| 2010/0156685 | A1* | 6/2010 | Westwick | H03M 1/002 |
| | | | | 341/135 |
| 2012/0306679 | A1* | 12/2012 | Zhu | H03M 1/002 |
| | | | | 341/155 |

OTHER PUBLICATIONS

Morie, T., et al.; "A 71dB-SNDR 50MS/s 4.2mW CMOS SAR ADC by SNR enhancement techniques of utilizing noise;" ISSCC 2013; Session 15; Data Converter Techniques; IEEE International Solid-State Circuits Conference; 2013; pp. 272-274.

Harpe, P., et al.; "A 2.2/2.7fJ/conversion-step 10/12b 40kS/s SAR ADC with Data-Driven Noise Reduction;" ISSCC 2013; Session 15; Data Converter Techniques; 2013; International Solid-State Circuits Conference; 2013; pp. 270-272.

* cited by examiner

US 9,673,832 B2

SUCCESSIVE APPROXIMATION ANALOG-TO-DIGITAL CONVERTER AND ACCURACY IMPROVING METHOD THEREOF

CROSS REFERENCE TO RELATED APPLICATIONS

This application claims the benefit of U.S. Provisional Application No. 62/162,237, filed May 15, 2015, the entirety of which is incorporated by reference herein.

BACKGROUND OF THE INVENTION

Field of the Invention

The present invention relates to a successive approximation register analog-to-digital converter (SAR ADC).

Description of the Related Art

A successive approximation register analog-to-digital converter (SAR ADC) is a type of analog-to-digital converter that converts a continuous analog signal into a digital representation using a search scheme.

One of the most common implementations of SAR ADC, the charge-redistribution SAR ADC, uses a plurality of capacitors. The capacitors are individually switched to couple to one of several voltage level choices in a search scheme for the approximation of an analog input of the SAR ADC. A comparator is required to generate the control signals of the switching capacitors. The comparator noise, however, considerably degrades the accuracy of the SAR ADC.

BRIEF SUMMARY OF THE INVENTION

A high-accuracy successive approximation register analog-to-digital converter (SAR ADC) and a method for analog-to-digital conversion are disclosed.

An SAR ADC in accordance with an exemplary embodiment of the invention comprises a successive approximation register (SAR) logic circuit, a comparator, and a capacitor network. The SAR logic circuit repeatedly generates digital control bits in a plurality of cycles of a search scheme of the SAR ADC. The comparator has a positive input terminal and a negative input terminal, and generates an output signal to be transmitted to the SAR logic circuit for generation of the digital control bits. The capacitor network comprises a plurality of positive terminal capacitors coupled to the positive input terminal of the comparator and a plurality of negative terminal capacitors coupled to the negative input terminal of the comparator. The positive terminal capacitors and the negative terminal capacitors sample an analog input of the SAR ADC in a sampling phase prior to the search scheme and are operated based on the digital control bits in the search scheme to reduce the voltage difference between the positive input terminal and the negative input terminal of the comparator. Digital representation of the analog input is approximated in the search scheme and output by the SAR logic circuit. The SAR logic circuit combines the output signal of the comparator collected during at least two successive cycles of the plurality of cycles of the search scheme to select between at least three capacitor network switching choices for controlling the voltage difference.

An analog-to-digital conversion method in accordance with an exemplary embodiment of the disclosure comprises the following steps: repeatedly generating digital control bits in a plurality of cycles of a search scheme, wherein digital representation of an analog input is approximated in the search scheme; providing a comparator that has a positive input terminal and a negative input terminal and generates an output signal for generation of the digital control bits; providing a capacitor network that comprises a plurality of positive terminal capacitors coupled to the positive input terminal of the comparator and a plurality of negative terminal capacitors coupled to the negative input terminal of the comparator, wherein the positive terminal capacitors and the negative terminal capacitors sample the analog input in a sampling phase prior to the search scheme and are operated based on the digital control bits in the search scheme to reduce a voltage difference between the positive input terminal and the negative input terminal of the comparator; and combining the output signal of the comparator collected during at least two successive cycles of the plurality of cycles of the search scheme to select between at least three capacitor network switching choices for controlling the voltage difference.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
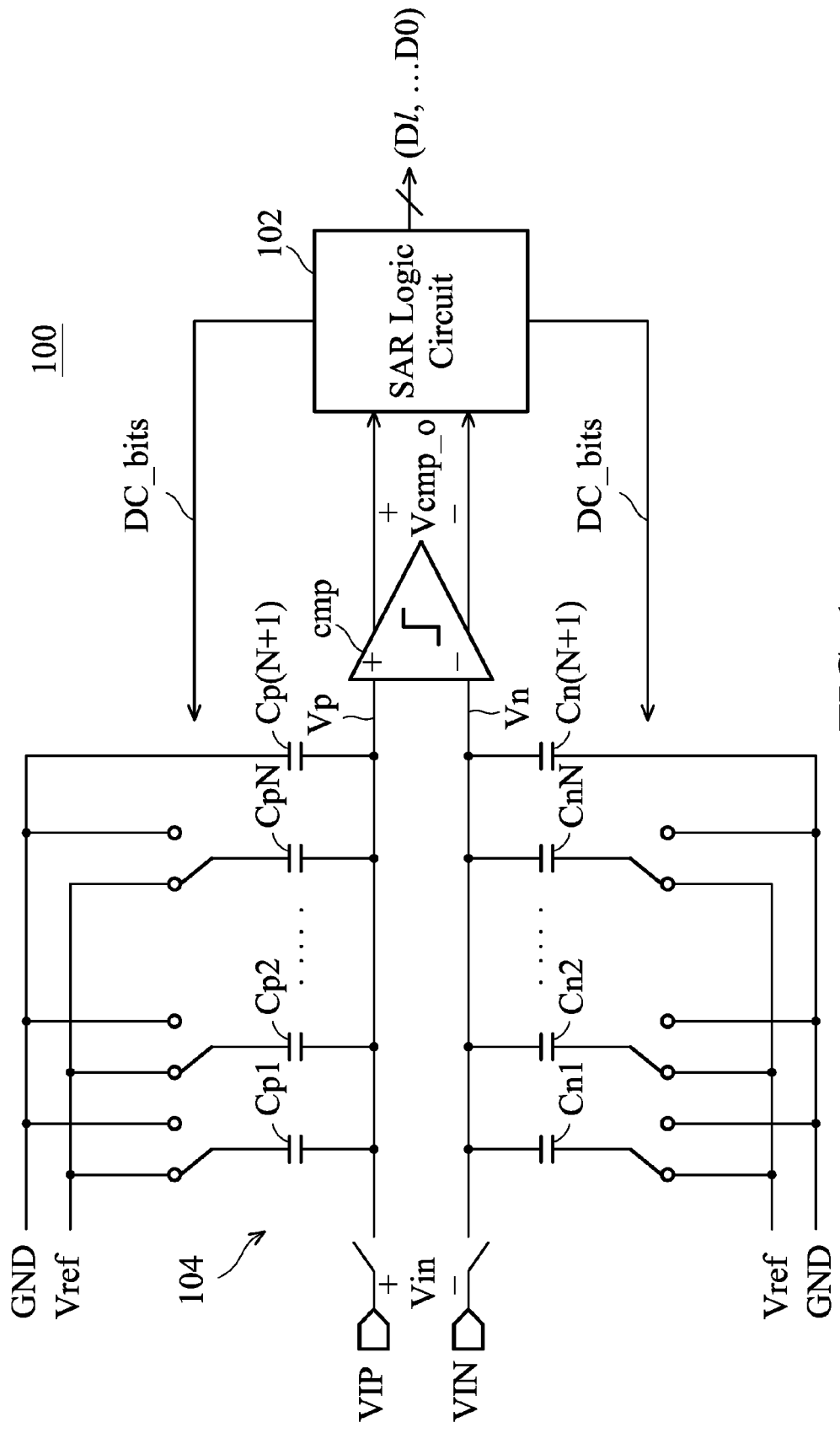
FIG. 1 depicts a successive approximation register analog-to-digital converter (SAR ADC) 100 in accordance with an exemplary embodiment of the invention.

FIG. 1 depicts a successive approximation register analog-to-digital converter (SAR ADC) 100 in accordance with an exemplary embodiment of the invention.

The SAR ADC 100 comprises a successive approximation register (SAR) logic circuit 102, a comparator cmp and a capacitor network 104. In comparison with the conventional charge-redistribution technique, the SAR logic circuit 102 is designed for high-accuracy analog-to-digital conversion, in which the noise of the comparator cmp is effectively suppressed.

The SAR logic circuit 102 repeatedly generates digital control bits DC_bits in a plurality of cycles (e.g., controlled by a clock) of a search scheme of the SAR ADC 100. The comparator cmp has a positive input terminal '+' at a voltage Vp and a negative input terminal '−' at a voltage Vn, and generates an output signal Vcmp_o to be transmitted to the SAR logic circuit 102 for generation of the digital control bits DC_bits. The capacitor network 104 comprises a plurality of positive terminal capacitors Cp1, Cp2 ... CpN coupled to the positive input terminal '+' of the comparator cmp, a fixed positive terminal capacitor Cp(N+1) fixed between the positive input terminal '+' of the comparator cmp and a ground terminal GND, a plurality of negative terminal capacitors Cn1, Cn2 ... CnN coupled to the negative input terminal '−' of the comparator cmp, and a fixed negative terminal capacitor Cn(N+1) fixed between the negative input terminal '−' of the comparator cmp and the ground terminal GND. The positive terminal capacitors Cp1, Cp2 ... CpN and the negative terminal capacitors Cn1, Cn2 ... CnN sample an analog input Vin of the SAR ADC in a sampling phase prior to the search scheme. In the search scheme, the positive terminal capacitors Cp1, Cp2 ... CpN and the negative terminal capacitors Cn1, Cn2 ... CnN are operated based on the digital control bits DC_bits generated by the SAR logic circuit 102 to progressively reduce a voltage difference |Vp−Vn| between the positive input terminal '+' and the negative input terminal '−' of the comparator cmp. Digital representation (Dl, ... D0) of the analog input Vin is approximated in the search scheme and output by the SAR logic circuit 102. The SAR logic circuit 102 combines the output signal Vcmp_o of the comparator cmp collected during at least two successive cycles of the plurality of cycles of the search scheme to make a one-step control for the voltage difference |VP−Vn|. At least three capacitor network switching choices are provided in the one-step control. By the one-step control, a selection between the at least three capacitor network switching choices is made to control the voltage difference |VP−Vn| according to the at least two comparison results of the comparator cmp obtained during at least two successive cycles.

According to the disclosure, multiple comparison results of the comparator cmp are combined together to operate the capacitor network 104. According to the combined comparison results, at least three choices are provided to switch the switchable capacitors (Cp1, Cp2 ... CpN and Cn1, Cn2 ... CnN) of the capacitor network 104. In an example wherein a comparator noise σ is 0.5 LSB, logic '1' is correctly output by the Comparator cmp in a probability, P(out=1), of 0.84 and is erroneously output as logic '0' by the comparator cmp in a probability, P(out=0), of 0.16. When comparing the same positive input twice, the comparator cmp outputs {1, 1} as two comparison results obtained in two successive cycles in a probability, P(out={1, 1}), of 0.7056 (i.e. P(out=1)$^2$), outputs {1, 0} or {0, 1} as two comparison results obtained in two successive cycles in a probability, P(out={1, 0} or {0, 1}), of 0.2688 (i.e. 2·P(out=1)·(1−P(out=1))), and outputs {0, 0} as two comparison results obtained in two successive cycles in a probability, P(out={0, 0}), of 0.0256 (i.e. (1−P(out=1))$^2$).

When the comparator cmp outputs {1, 1} as two comparison results obtained in two successive cycles, a capacitor network switching choice pulling down the voltage Vp to reduce a voltage difference |Vp−Vn| is correctly adopted to control the voltage difference |Vp−Vn|. When the comparator cmp outputs {1, 0} or {0, 1}, a capacitor network switching choice not changing the voltages Vp and Vn is adopted to control the voltage difference |Vp−Vn| and thereby the voltage difference |Vp−Vn| is not erroneously adjusted. The voltage difference |Vp−Vn| is only erroneously adjusted by a capacitor network switching choice that pulls up the voltage Vp to increase the voltage difference |Vp−Vn| because of the successive erroneous comparison results {0, 0}. In comparison with P(out=0) which is 0.16, the erroneous capacitor network switching choice is selected in a much lower probability 0.0256 (i.e., P(out={0, 0}). The noise problem of the comparator cmp is effectively reduced because of the accumulated comparison information (e.g. combined comparison results of the comparator cmp obtained in successive cycles). The various capacitor network switching choices also help the accuracy of the SAR ADC 100.

In the exemplary embodiment of FIG. 1, during the sampling phase, a positive receiving terminal VIP and a negative receiving terminal VIN of the analog input Vin are coupled to the positive input terminal '+' and the negative input terminal '−' of the comparator cmp, respectively, and the positive terminal capacitors Cp1, Cp2 ... CpN are coupled between a reference voltage Vref and the positive input terminal '+' of the comparator cmp, and the negative terminal capacitors Cn1, Cn2 ... CnN are coupled between the reference voltage Vref and the negative input terminal '−' of the comparator cmp. The connection condition of the positive terminal capacitors Cp1, Cp2 ... CpN and the connection condition of the negative terminal capacitors Cn1, Cn2 ... CnN are adjusted in the search scheme.

Figure 2:
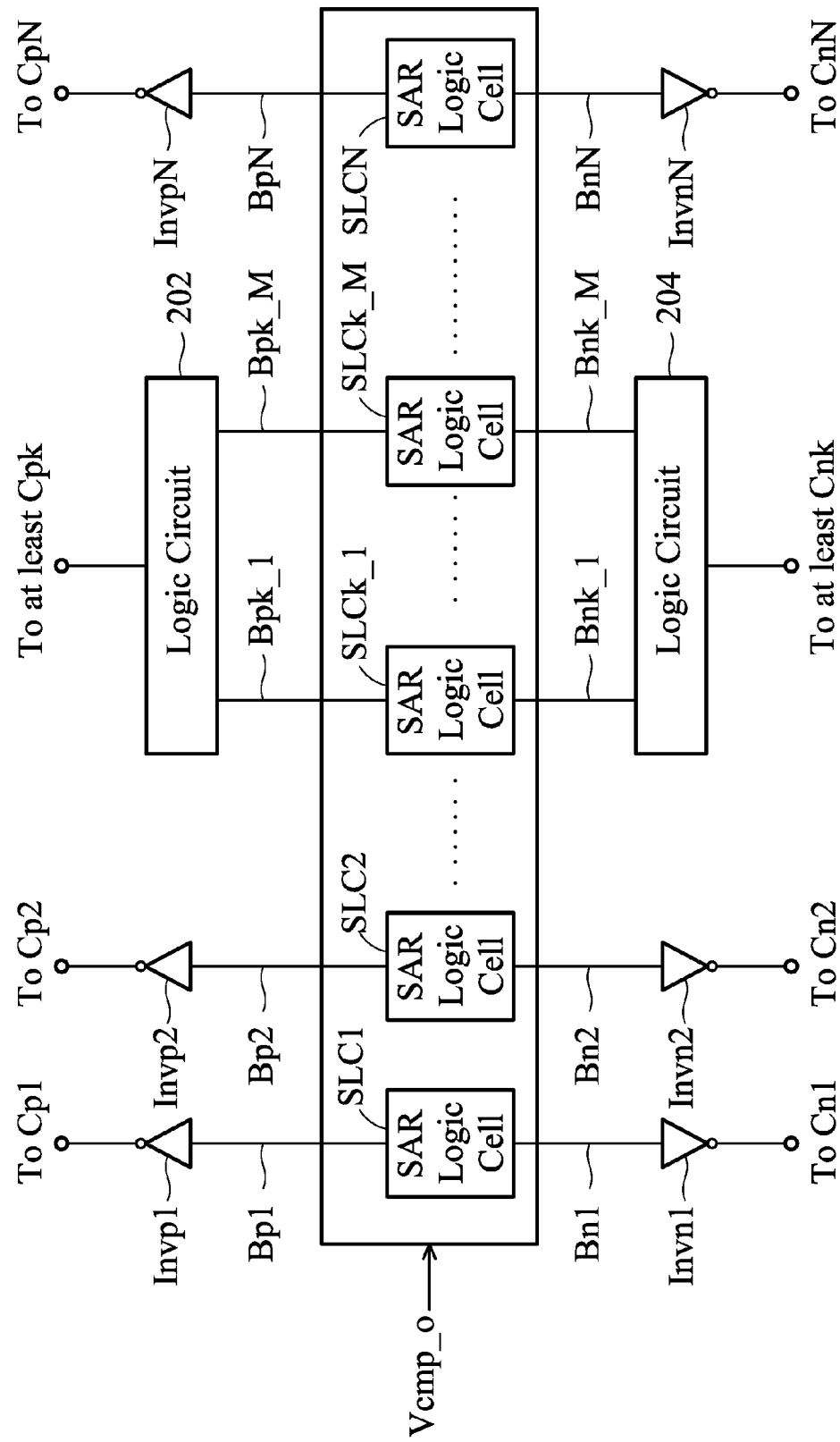
FIG. 2 depicts a plurality of SAR cells SLC1, SLC2 . . . SLCk_1~SLCk_M . . . SLCN generating digital bits (Bp1, Bp2 . . . Bpk_1~Bpk_M . . . BpN) and (Bn1, Bn2 . . . Bnk_1~Bnk_M . . . BnN) and a capacitor switching logic including inverters Invp1, Invp2, . . . InvpN, and inverters Invn1, Invn2 . . . InvnN and logic circuits 202 and 204.

FIG. 2 depicts a plurality of SAR cells SLC1, SLC2 ... SLCk_1~SLCk_M ... SLCN generating digital bits (Bp1, Bp2 ... Bpk_1~Bpk_M ... BpN) and (Bn1, Bn2 ... Bnk_1~Bnk_M ... BnN) and a capacitor switching logic including inverters Invp1, Invp2, ... InvpN, and inverters Invn1, Invn2 ... InvnN and logic circuits 202 and 204. The SAR cells SLC1, SLC2 ... SLCk_1~SLCk_M ... SLCN each correspond to one cycle of the search scheme.

In the first cycle of the search scheme, when the comparator output Vcmp_o shows that voltage Vp is higher than the voltage Vn, the SAR logic cell SLC1 asserts the digital bit Bp1 to '1' and the keeps the digital bit Bn1 '0'. Thus, the inverter Invp1 outputs '0' to switch the positive terminal capacitor Cp1 to ground GND and the inverter Invn1 outputs '1' to keep coupling the negative terminal capacitor Cn1 between the negative input terminal '−' of the comparator cmp and the reference voltage Vref. The voltage Vp is pulled down and the voltage difference |Vp−Vn| is reduced. Conversely, when the comparator output Vcmp_o shows that voltage Vp is lower than the voltage Vn in the first cycle of the search scheme, the SAR logic cell SLC1 keeps the digital bit Bp1 at logic '0' and asserts the digital bit Bn1 to '1'. Thus, the inverter Invp1 outputs '1' to keep coupling the positive terminal capacitor Cp1 between the positive input terminal '+' of the comparator cmp and the reference voltage Vref, and the inverter Invn1 outputs '0' to switch the negative terminal capacitor Cn1 to ground GND. The voltage Vn is pulled down and the voltage difference |Vp−Vn| is reduced. The capacitor switching procedure repeats in the other cycles of the search scheme expect for the M cycles in which the digital bits Bpk_1 to Bpk_M and Bnk_1 to Bnk_M are generated. The M comparison results collected during the M cycles (e.g. Vcmp_o provided from the comparator cmp of FIG. 1 during the corresponding M cycles of the search scheme) are combined together to make a one-step control for the voltage difference |Vp−Vn| based on the M comparison results, by which a selection between at least three capacitor network switching choices is made to control the voltage difference |Vp−Vn| according to the M comparison results of the comparator cmp obtained from the corresponding M successive cycles of the search scheme. M is a positive integer greater than 1. As shown, the logic circuit 202 is coupled to at least the positive terminal capacitor Cpk and the logic circuit 204 is coupled to at least the negative terminal capacitor Cnk to provide the at least three capacitor network switching choices. In some exemplary embodiments, the logic circuit 202 is not only coupled to the positive terminal capacitor Cpk and is further coupled to other positive terminal capacitor(s). In some exemplary embodiments, the logic circuit 204 is not only coupled to the negative terminal capacitor Cnk and is further coupled to other negative terminal capacitor(s). The design of the logic circuits 202 and 204 are described below.

In this paragraph, one example of the logic circuits 202 and 204 is discussed. When the output signal Vcmp_o of the comparator cmp collected during the M successive cycles is kept at logic 1 (Bpk_1 to Bpk_M all are '1' and Bnk_1 to Bnk_M all are '0'), the logic circuit 202 is designed to pull down the voltage Vp to accomplish the one-step control for the voltage difference |Vp−Vn|. When the output signal Vcmp_o of the comparator cmp collected during the M successive cycles is kept at logic 0 (Bpk_1 to Bpk_M all are '0' and Bnk_1 to Bnk_M all are '1'), the logic circuit 204 is designed to pull down the voltage Vn to accomplish the one-step control for the voltage difference |Vp−Vn|. When the output signal Vcmp_o of the comparator cmp switches between logic 1 and logic 0 during the M successive cycles, the logic circuits 202 and 204 keep the voltages Vp and Vn unchanged during the one-step control of the voltage difference |Vp−Vn|. The logic circuits 202 and 204 are designed to provide three capacitor network switching choices for the one-step control based on the comparison results collected during the M successive cycles of the search scheme. In an exemplary embodiment, only the pair of capacitors Cpk and Cnk is switchable during the one-step control. When the output signal Vcmp_o of the comparator cmp collected during the M successive cycles is kept at logic 1, the logic circuit 202 couples the respective positive terminal capacitor Cpk between the positive input terminal '+' of the comparator cmp and the ground terminal GND to accomplish the one-step control for the voltage difference |Vp−Vn|. When the output signal Vcmp_o of the comparator cmp collected during the M successive cycles is kept at logic 0, the logic circuit 204 couples the respective negative terminal capacitor Cnk between the negative input terminal '−' of the comparator cmp and the ground terminal GND to accomplish the one-step control for the voltage difference |Vp−Vn|. When the output signal Vmp_o of the comparator cmp switches between logic 1 and logic 0 during the M successive cycles, the logic circuit 202 keeps a connection status of the respective positive terminal capacitor Cpk and the logic circuit 204 keeps a connection status of the respective negative terminal capacitor Cnk during the one-step control of the voltage difference |Vp−Vn|.

In another exemplary embodiment, the logic circuits 202 and 204 are designed to provide (M+1) capacitor network switching choices for the one-step control based on the comparison results collected during the M successive cycles of the search scheme. The more logic 1 the comparator cmp outputs during the M successive cycles, the deeper the voltage Vp is pulled down to accomplish the one-step control for the voltage difference |Vp−Vn|. The more logic 0 the comparator cmp outputs during the M successive cycles, the deeper the voltage Vn is pulled down to accomplish the one-step control for the voltage difference |Vp−Vn|. In an exemplary embodiment, multiple pairs of positive and negative terminal capacitors are switchable during the one-step control. The more logic 1 the comparator cmp outputs during the M successive cycles, the more of the switchable positive terminal capacitors are changed to couple between the positive input terminal '+' of the comparator cmp and the ground terminal GND to accomplish the one-step control for the voltage difference |Vp−Vn|. The more logic 0 the comparator cmp outputs during the M successive cycles, the more of the switchable negative terminal capacitors are changed to couple between the negative input terminal '−' of the comparator cmp and the ground terminal GND to accomplish the one-step control for the voltage difference |Vp−Vn|.

Figure 3:
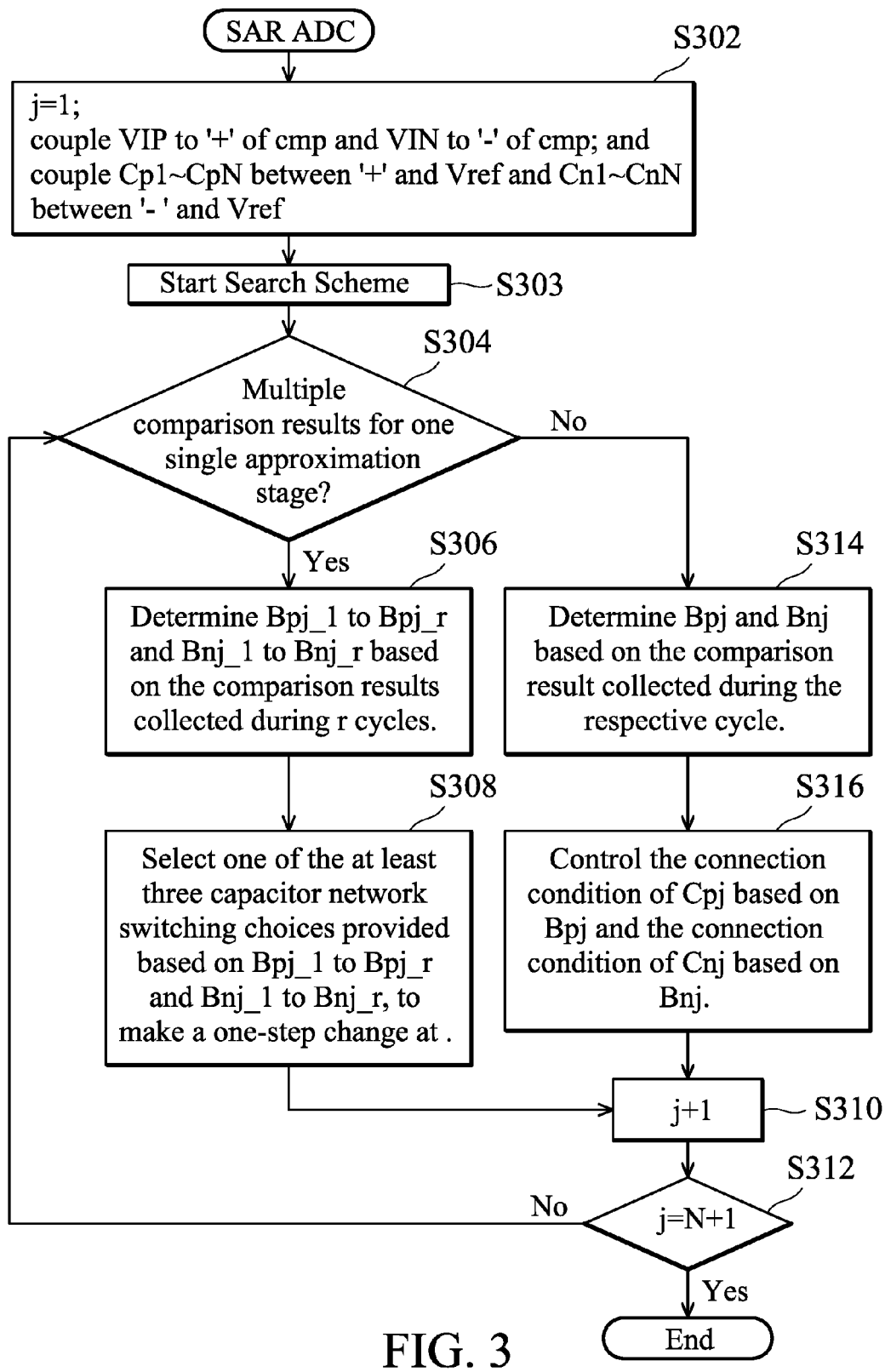
FIG. 3 is a flowchart depicting the operations of the SAR ADC 100 in accordance with an exemplary embodiment of the disclosure.

FIG. 3 is a flowchart depicting the operations of the SAR ADC 100 in accordance with an exemplary embodiment of the disclosure. In step S302, a variable j is initialized to 1 and the SAR ADC 100 is in a sampling phase. The positive receiving terminal VIP and the negative receiving terminal VIN of the analog input Vin are coupled to the positive input terminal '+' and the negative input terminal '−' of the comparator cmp and the N positive terminal capacitors Cp1 to CpN are coupled between the reference voltage Vref and the positive input terminal '+' of the comparator cmp and the N negative terminal capacitors Cn1 to CnN are coupled between the reference voltage Vref and the negative input terminal '−' of the comparator cmp. Then, by step S303, the search scheme for the digital representation (Dl, . . . D0) of the analog input Vin starts and the positive receiving terminal VIP and the negative receiving terminal VIN of the analog input Vin are disconnected from the positive input terminal '+' and the negative input terminal '−' of the comparator cmp. When step S304 determines that multiple comparison results are combined together for one single approximation stage (i.e. one switching step of the capacitor network 104, corresponding to the one-step control for the voltage difference |Vp−Vn|, step S306 is performed to determine the digital bits Bpj_1 to Bpj_r and Bnj_1 to Bnj_r based on the comparison results collected during r cycles (e.g. repeating the comparison of the comparator cmp r times). Corresponding to the digital bits Bpj_1 to Bpj_r and Bnj_1 to Bnj_r collected during the r cycles of the search scheme, at least three capacitor network switching choices are provided. In step S308, one of the at least three capacitor network switching choices is selected based on the obtained digital bits Bpj_1 to Bpj_r and Bnj_1 to Bnj_r and, accordingly, a one-step change occurs at the voltage difference |Vp−Vn| at the input side of the comparator cmp. Step S310 is performed to add one to the variable j. Step S312 checks whether the variable j is N+1. If not, step S304 is repeated. If yes, the search scheme ends and the digital representation (Dl, . . . D0) of the analog input Vin is available. When the determination in step S304 is not true, step S314 is performed to determine the digital bits Bpj and Bnj based on the comparison result collected during the respective cycle. In step S316, the respective positive terminal capacitor Cpj is switched from the reference voltage Vref to the ground terminal GND and the respective negative terminal capacitor Cnj remains coupling to the reference voltage Vref when the digital bit Bpj is 1 and the digital bit Bnj is 0, and the respective positive terminal capacitor Cpj remains coupling to the reference voltage Vref and the respective negative terminal capacitor Cnj is switched from the reference voltage Vref to the ground terminal GND when the digital bit Bpj is 0 and the digital bit Bnj is 1. Then, steps S310 and S312 are performed.

Figure 4:
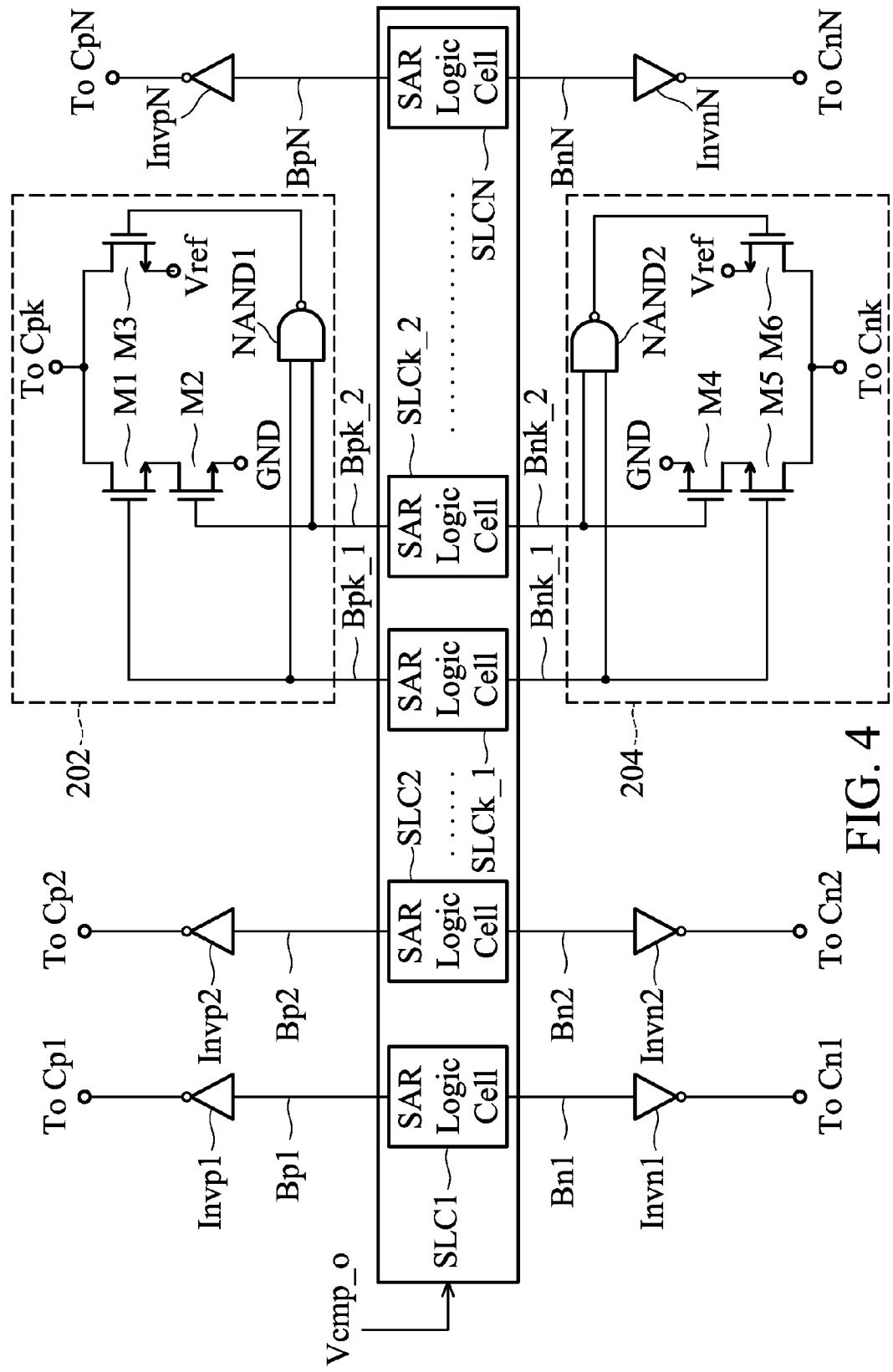
FIG. 4 shows an example of the logic circuits 202 and 204 wherein M is 2 and only one pair of the positive and negative terminal capacitors Cpk and Cnk is switchable during the respective two cycles of the search scheme.

FIG. 4 shows an example of the logic circuits 202 and 204 wherein M is 2 and only one pair of the positive and negative terminal capacitors Cpk and Cnk is switchable during the respective two cycles of the search scheme. Digital bits Bpk_1 and Bpk_2 generated during the respective two cycles are combined together to control the connection status of the positive terminal capacitor Cpk and, in the respective approximation stage, digital bits Bnk_1~Bnk_2 are negative values of Bpk_1 and Bpk_2 and are combined together to control the connection status of the negative terminal capacitor Cnk. Three NMOSs M1 to M3 and one NAND gate NAND1 form the logic circuit 202. Three NMOSs M4 to M6 and one NAND gate NAND2 form the logic circuit 204. The NMOSs M1 and M2 are coupled between the positive terminal capacitor Cpk and the ground terminal GND and controlled by the digital bits Bpk_1 and Bpk_2. The NAND gate NAND1 receives the digital bits Bpk_1 and Bpk_2 and the output of the NAND gate NAND1 controls the NMOS M3. The NMOS M3 is coupled between the positive terminal capacitor Cpk and the reference voltage Vref. The NMOSs M4 and M5 are coupled between the negative terminal capacitor Cnk and the ground terminal GND and controlled by the digital bits Bnk_1 and Bnk_2. The NAND gate NAND2 receives the digital bits Bnk_1 and Bnk_2 and the output of the NAND gate NAND2 controls the NMOS M6. The NMOS M6 is coupled between the negative terminal capacitor Cnk and the reference voltage Vref.

Figure 5A:
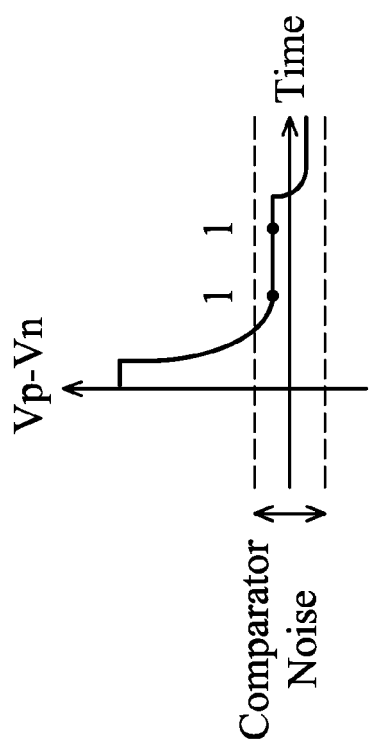
FIG. 5A, FIG. 5B and FIG. 5C show different changes on (Vp−Vn) with respect to the three capacitor network switching choices provided by that shown in FIG. 4.
Figure 5C:
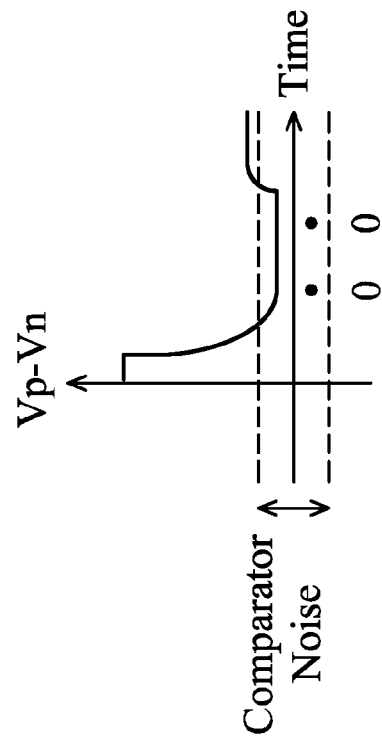
Figure 5B:
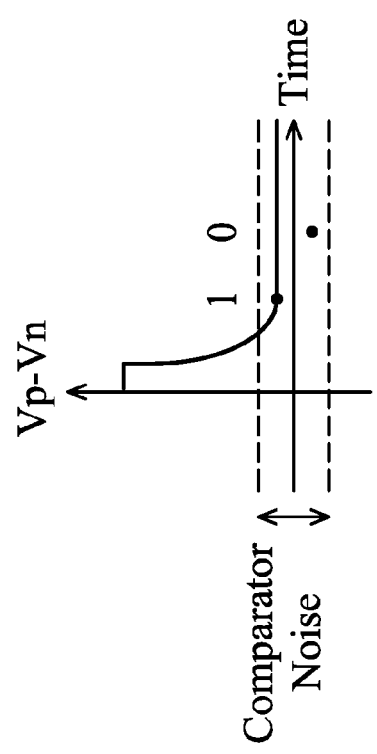

FIG. 5A, FIG. 5B and FIG. 5C show different changes on (Vp−Vn) with respect to the three capacitor network switching choices provided by that shown in FIG. 4.

In FIG. 5A, the comparator cmp outputs correct comparison results (1, 1) during two successive cycles and accordingly, the voltage Vp is pulled down in one step to successfully reduce the value (Vp−Vn). In FIG. 5B, the comparator cmp outputs confused comparison results (1, 0) (or (0, 1)) during two successive cycles and accordingly, no change is made on the capacitor network and the voltage difference between the positive input terminal '+' and the negative input terminal '−' of the comparator cmp is not erroneously adjusted. In FIG. 5C, the comparator cmp repeatedly outputs the erroneous comparison results, outputting (0, 0), during two successive cycles and the voltage Vn is erroneously pulled down in one step to erroneously increase the value (Vp−Vn). When the comparator cmp in the noise range has an 84 percent possibility to output correct comparison (logic '1'), there is only a 2.56 percent possibility to erroneously output (0,0) and erroneously switch the capacitor network. High accuracy SAR ADC, therefore, is provided.

Figure 6:
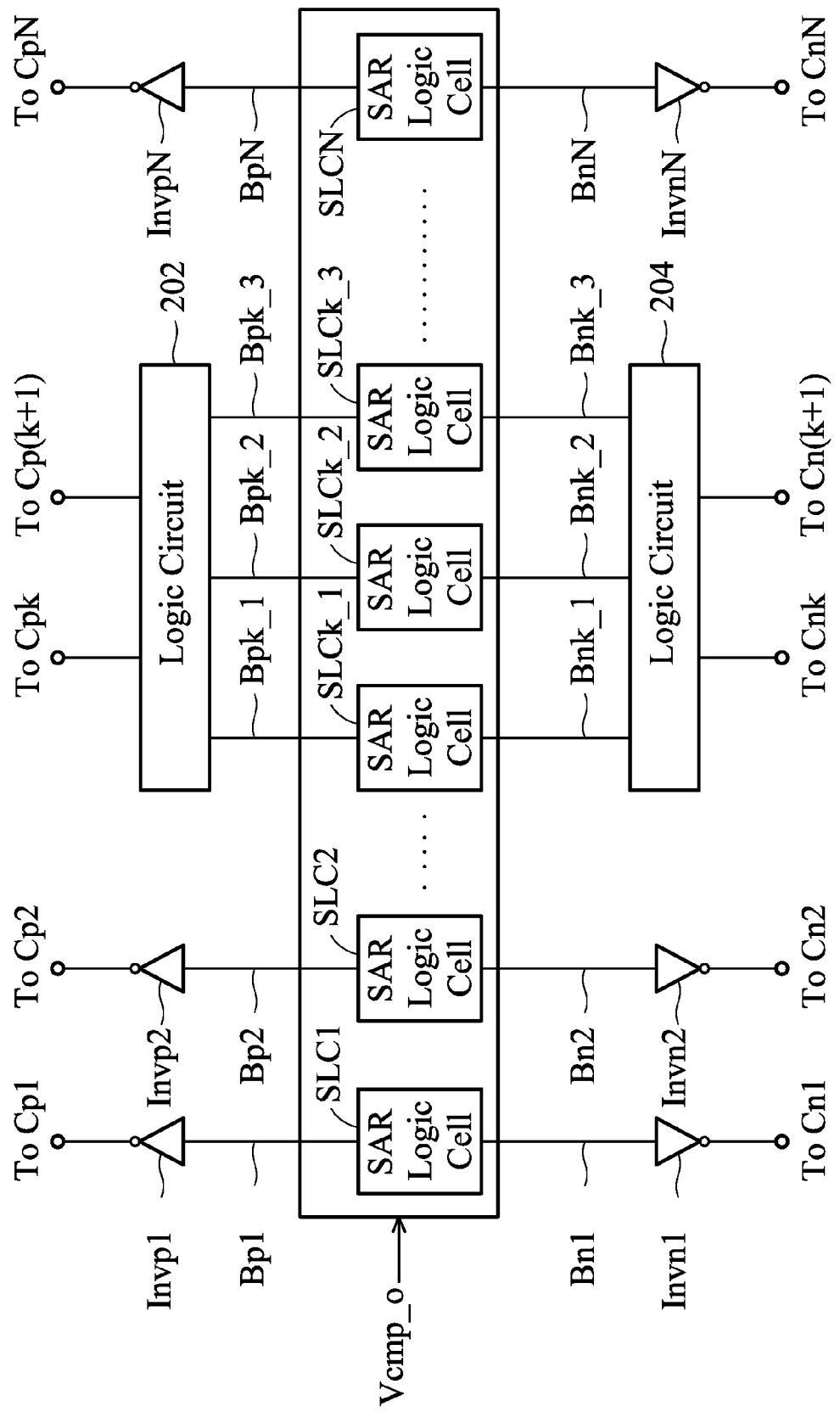
FIG. 6 shows another example of the logic circuits 202 and 204 wherein M is 3 and two pairs of the positive and negative terminal capacitors Cpk and Cnk and Cp(k+1) and Cn(k+1) are switchable during the respective three cycles of the search scheme.

FIG. 6 shows another example of the logic circuits 202 and 204 wherein M is 3 and two pairs of the positive and negative terminal capacitors Cpk and Cnk and Cp(k+1) and Cn(k+1) are switchable during the respective three cycles of the search scheme. Digital bits Bpk_1~Bpk_3 generated during the respective three cycles are combined together to control the connection status of the positive terminal capacitors Cpk and Cp(k+1) and, in the respective approximation stage, digital bits Bnk_1~Bnk_3 are negative values of Bpk_1~Bpk_3 and are combined together to control the connection status of the negative terminal capacitors Cnk and Cn(k+1).

Figure 7:
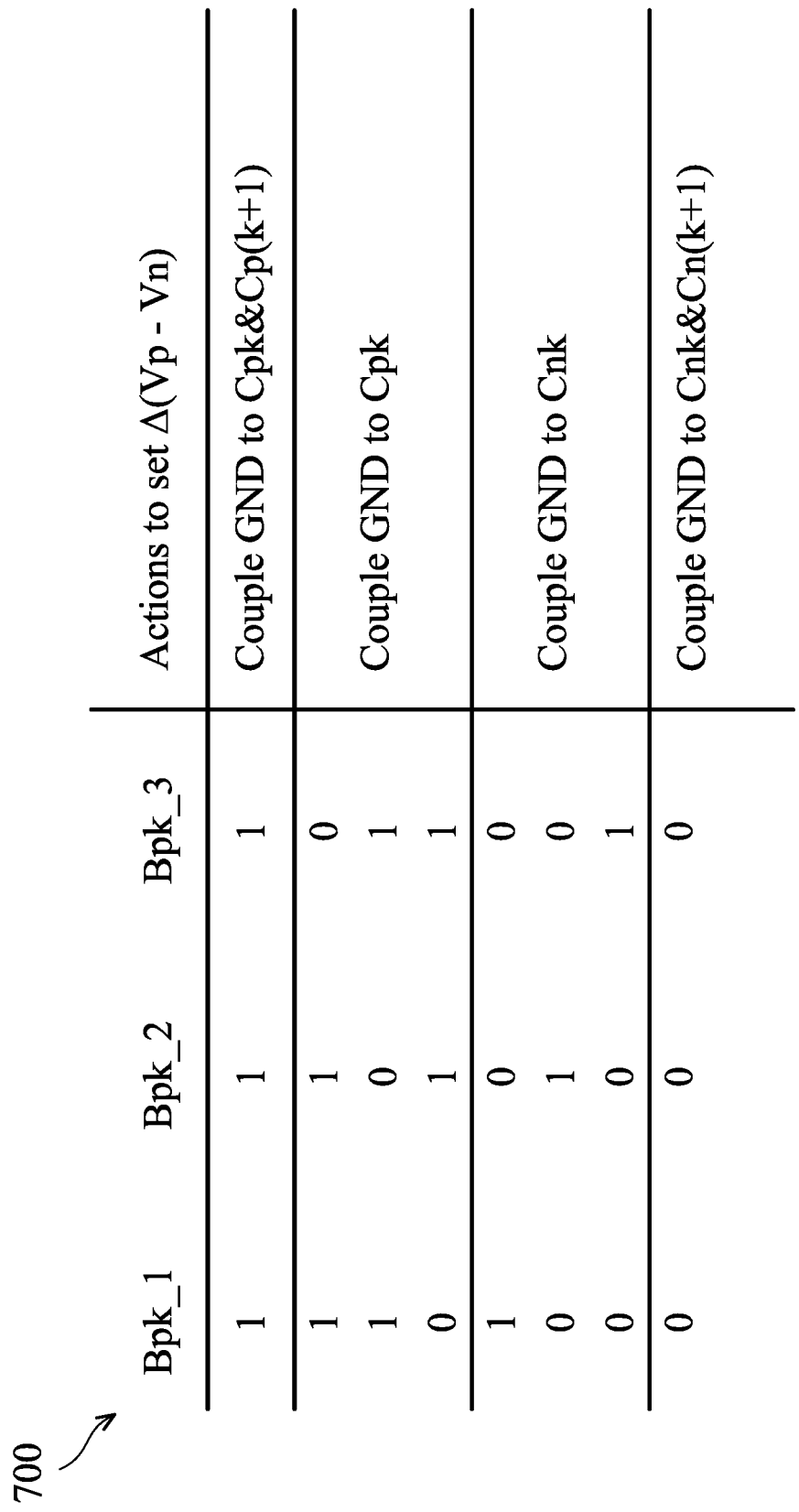
FIG. 7 is a table 700 depicting different capacitor network switching choices provided by that shown in FIG. 6.

FIG. 7 is a table 700 depicting different capacitor network switching choices provided by that shown in FIG. 6. When (Bpk_1, Bpk_2, Bpk_3) is (1, 1, 1), the positive terminal capacitors Cpk and Cp(k+1) both are switched from the reference voltage Vref to the ground terminal GND to significantly pulls down the positive input terminal '+' of the comparator cmp. When (Bpk_1, Bpk_2, Bpk_3) is (1, 1, 0), (1, 0, 1) or (0, 1, 1), the positive terminal capacitor Cpk is switched from the reference voltage Vref to the ground terminal GND with the connection status of the positive terminal capacitors Cp(k+1) unchanged to less significantly pulls down the positive input terminal '+' of the comparator cmp. When (Bpk_1, Bpk_2, Bpk_3) is (0, 0, 0), the positive terminal capacitors Cnk and Cn(k+1) both are switched from the reference voltage Vref to the ground terminal GND to significantly pulls down the negative input terminal '−' of the comparator cmp. When (Bpk_1, Bpk_2, Bpk_3) is (1, 0, 0), (0, 1, 0) or (0, 0, 1), the negative terminal capacitor Cnk is switched from the reference voltage '−' to the ground terminal GND with the connection status of the negative terminal capacitors Cn(k+1) unchanged to less significantly pulls down the negative input terminal Vn of the comparator cmp.

In some exemplary embodiments, only the final approximation stages require the combined comparison results because the comparator noise mainly damages the ADC accuracy in the final approximation stages.

The analog-to-digital conversion (ADC) method based on the comparator cmp and the capacitor network architecture of FIG. 1 is also within the scope of the invention. The ADC method repeatedly generates digital control bits DC_bits in a plurality of cycles of a search scheme, wherein digital representation (Dl, . . . D0) of an analog input Vin is approximated in the search scheme. According to the ADC method, the positive terminal capacitors Cp1 to CpN and the negative terminal capacitors Cn1 to CnN sample the analog input Vin in a sampling phase prior to the search scheme and are operated based on the digital control bits DC_bits in the search scheme to progressively reduce a voltage difference |Vp−Vn| Vn between the positive input terminal '+' and the negative input terminal '−' of the comparator cmp. Furthermore, the output signal Vcmp_o of the comparator cmp collected during at least two successive cycles of the plurality of cycles of the search scheme are combined to make a one-step control for the voltage difference |Vp−Vn|. At least three capacitor network switching choices are provided based on the combined comparison results. By the one-step control, a selection between the at least three capacitor network switching choices is made to control the voltage difference |Vp−Vn| according to at least two comparison results of the comparator cmp obtained from at least two successive cycles.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A successive approximation register analog-to-digital converter, comprising:
   a successive approximation register logic circuit, repeatedly generating digital control bits in a plurality of cycles of a search scheme of the successive approximation register analog-to-digital converter;

a comparator, having a positive input terminal and a negative input terminal, and generating an output signal to be transmitted to the successive approximation register logic circuit for generation of the digital control bits; and a capacitor network, comprising a plurality of positive terminal capacitors coupled to the positive input terminal of the comparator and a plurality of negative terminal capacitors coupled to the negative input terminal of the comparator, wherein the positive terminal capacitors and the negative terminal capacitors sample an analog input of the successive approximation register analog-to-digital converter in a sampling phase prior to the search scheme and are operated based on the digital control bits in the search scheme to reduce a voltage difference between the positive input terminal and the negative input terminal of the comparator, wherein:

a digital representation of the analog input is approximated in the search scheme and output by the successive approximation register logic circuit; and the successive approximation register logic circuit combines the output signal of the comparator collected during at least two successive cycles of the plurality of cycles of the search scheme to select between at least three capacitor network switching choices for controlling the voltage difference, wherein when the output signal of the comparator collected during the at least two successive cycles is kept at logic 1, the successive approximation register logic circuit pulls down a voltage level at the positive input terminal of the comparator;

when the output signal of the comparator collected during the at least two successive cycles is kept at logic 0, the successive approximation register logic circuit pulls down a voltage level at the negative input terminal of the comparator; and when the output signal of the comparator switches between logic 1 and logic 0 during the at least two successive cycles, the successive approximation register logic circuit keeps the voltage levels at the positive input terminal and the negative input terminal of the comparator.

2. The successive approximation register analog-to-digital converter as claimed in claim 1, wherein:

the successive approximation register logic circuit combines the output signal of the comparator collected during M successive cycles of the plurality of cycles of the search scheme to select between (M+1) capacitor network switching choices for controlling the voltage difference; and M is an integer number greater than 1.

3. The successive approximation register analog-to-digital converter as claimed in claim 2, wherein:

the more logic 1 the comparator outputs during the M successive cycles, the deeper the successive approximation register logic circuit pulls down a voltage level at the positive input terminal of the comparator; and the more logic 0 the comparator outputs during the M successive cycles, the deeper the successive approximation register logic circuit pulls down the voltage level at the negative input terminal of the comparator.

4. A successive approximation register analog-to-digital converter, comprising:

a successive approximation register logic circuit, repeatedly generating digital control bits in a plurality of cycles of a search scheme of the successive approximation register analog-to-digital converter;

a comparator, having a positive input terminal and a negative input terminal, and generating an output signal to be transmitted to the successive approximation register logic circuit for generation of the digital control bits; and a capacitor network, comprising a plurality of positive terminal capacitors coupled to the positive input terminal of the comparator and a plurality of negative terminal capacitors coupled to the negative input terminal of the comparator, wherein the positive terminal capacitors and the negative terminal capacitors sample an analog input of the successive approximation register analog-to-digital converter in a sampling phase prior to the search scheme and are operated based on the digital control bits in the search scheme to reduce a voltage difference between the positive input terminal and the negative input terminal of the comparator, wherein:

a digital representation of the analog input is approximated in the search scheme and output by the successive approximation register logic circuit; and the successive approximation register logic circuit combines the output signal of the comparator collected during at least two successive cycles of the plurality of cycles of the search scheme to select between at least three capacitor network switching choices for controlling the voltage difference, wherein:

during the sampling phase, a positive receiving terminal and a negative receiving terminal of the analog input are coupled to the positive input terminal and the negative input terminal of the comparator, respectively, and the positive terminal capacitors are coupled between a reference terminal that provides a reference voltage level and the positive input terminal and the negative terminal capacitors are coupled between the reference terminal and the negative input terminal.

5. The successive approximation register analog-to-digital converter as claimed in claim 4, wherein:

when the output signal of the comparator collected during the at least two successive cycles is kept at logic 1, the successive approximation register logic circuit couples a respective positive terminal capacitor of the plurality of positive terminal capacitors between the positive input terminal of the comparator and a ground terminal;

when the output signal of the comparator collected during the at least two successive cycles is kept at logic 0, the successive approximation register logic circuit couples a respective negative terminal capacitor of the plurality of negative terminal capacitors between the negative input terminal of the comparator and the ground terminal; and when the output signal of the comparator switches between logic 1 and logic 0 during the at least two successive cycles, the successive approximation register logic circuit keeps a connection status of the respective positive terminal capacitor and a connection status of the respective negative terminal capacitor.

6. The successive approximation register analog-to-digital converter as claimed in claim 4, wherein:

the successive approximation register logic circuit combines the output signal of the comparator collected during two successive cycles of the plurality of cycles of the search scheme to select between three capacitor network switching choices for controlling the voltage difference;

when the output signal of the comparator collected during the two successive cycles is kept at logic 1, the successive approximation register logic circuit couples a respective positive terminal capacitor of the plurality of positive terminal capacitors between the positive input terminal of the comparator and a ground terminal;

when the output signal of the comparator collected during the two successive cycles is kept at logic 0, the successive approximation register logic circuit couples a respective negative terminal capacitor of the plurality of negative terminal capacitors between the negative input terminal of the comparator and the ground terminal; and when the output signal of the comparator switches between logic 1 and logic 0 during the two successive cycles, the successive approximation register logic circuit keeps a connection status of the respective positive terminal capacitor and a connection status of the respective negative terminal capacitor.

7. The successive approximation register analog-to-digital converter as claimed in claim 4, wherein:

the successive approximation register logic circuit combines the output signal of the comparator collected during M successive cycles of the plurality of cycles of the search scheme to select between (M+1) capacitor network switching choices for controlling the voltage difference; and M is an integer number greater than 1.

8. The successive approximation register analog-to-digital converter as claimed in claim 7, wherein:

the more logic 1 the comparator outputs during the M successive cycles, the more of the positive terminal capacitors are changed to couple between the positive input terminal of the comparator and a ground terminal; and the more logic 0 the comparator outputs during the M successive cycles, the more of the negative terminal capacitors are changed to couple between the negative input terminal of the comparator and the ground terminal.

9. The successive approximation register analog-to-digital converter as claimed in claim 4, wherein the capacitor network further comprises:

a fixed positive terminal capacitor, fixed between the positive input terminal of the comparator and a ground terminal; and a fixed negative terminal capacitor, fixed between the negative input terminal of the comparator and the ground terminal.

10. An analog-to-digital conversion method, comprising:

repeatedly generating digital control bits in a plurality of cycles of a search scheme, wherein a digital representation of an analog input is approximated in the search scheme;

providing a comparator that has a positive input terminal and a negative input terminal and generates an output signal for generation of the digital control bits;

providing a capacitor network that comprises a plurality of positive terminal capacitors coupled to the positive input terminal of the comparator and a plurality of negative terminal capacitors coupled to the negative input terminal of the comparator, wherein the positive terminal capacitors and the negative terminal capacitors sample the analog input in a sampling phase prior to the search scheme and are operated based on the digital control bits in the search scheme to reduce a voltage difference between the positive input terminal and the negative input terminal of the comparator;

combining the output signal of the comparator collected during at least two successive cycles of the plurality of cycles of the search scheme to select between at least three capacitor network switching choices for controlling the voltage difference, pulling down a voltage level at the positive input terminal of the comparator when the output signal of the comparator collected during the at least two successive cycles is kept at logic 1;

pulling down a voltage level at the negative input terminal of the comparator when the output signal of the comparator collected during the at least two successive cycles is kept at logic 0; and keeping the voltage levels at the positive input terminal and the negative input terminal of the comparator when the output signal of the comparator switches between logic 1 and logic 0 during the at least two successive cycles.

11. The analog-to-digital conversion method as claimed in claim 10, wherein:

the output signal of the comparator collected during M successive cycles of the plurality of cycles of the search scheme is combined to select between (M+1) capacitor network switching choices for controlling the voltage difference; and M is an integer number greater than 1.

12. The analog-to-digital conversion method as claimed in claim 11, wherein:

the more logic 1 the comparator outputs during the M successive cycles, the deeper a voltage level at the positive input terminal of the comparator is pulled down; and the more logic 0 the comparator outputs during the M successive cycles, the deeper the voltage level at the positive input terminal of the comparator is pulled down.

13. An analog-to-digital conversion method, comprising:

repeatedly generating digital control bits in a plurality of cycles of a search scheme, wherein a digital representation of an analog input is approximated in the search scheme;

providing a comparator that has a positive input terminal and a negative input terminal and generates an output signal for generation of the digital control bits;

providing a capacitor network that comprises a plurality of positive terminal capacitors coupled to the positive input terminal of the comparator and a plurality of negative terminal capacitors coupled to the negative input terminal of the comparator, wherein the positive terminal capacitors and the negative terminal capacitors sample the analog input in a sampling phase prior to the search scheme and are operated based on the digital control bits in the search scheme to reduce a voltage difference between the positive input terminal and the negative input terminal of the comparator;

combining the output signal of the comparator collected during at least two successive cycles of the plurality of cycles of the search scheme to select between at least three capacitor network switching choices for controlling the voltage difference, wherein:

during the sampling phase, a positive receiving terminal and a negative receiving terminal of the analog input are coupled to the positive input terminal and the negative input terminal of the comparator, respectively, and the positive terminal capacitors are coupled between a reference terminal that provides a reference voltage level and the positive input terminal and the negative terminal capacitors are coupled between the reference terminal and the negative input terminal.

14. The analog-to-digital conversion method as claimed in claim 13, wherein:
when the output signal of the comparator collected during the at least two successive cycles is kept at logic 1, a respective positive terminal capacitor of the plurality of positive terminal capacitors is coupled between the positive input terminal of the comparator and a ground terminal;
when the output signal of the comparator collected during the at least two successive cycles is kept at logic 0, a respective negative terminal capacitor of the plurality of negative terminal capacitors is coupled between the negative input terminal of the comparator and the ground terminal; and
when the output signal of the comparator switches between logic 1 and logic 0 during the at least two successive cycles, a connection status of the respective positive terminal capacitor and a connection status of the respective negative terminal capacitor are kept.

15. The analog-to-digital conversion method as claimed in claim 13, wherein:
the output signal of the comparator collected during two successive cycles of the plurality of cycles of the search scheme is combined to select between three capacitor network switching choices for controlling the voltage difference;
when the output signal of the comparator collected during the two successive cycles is kept at logic 1, a respective positive terminal capacitor of the plurality of positive terminal capacitors is coupled between the positive input terminal of the comparator and a ground terminal;
when the output signal of the comparator collected during the two successive cycles is kept at logic 0, a respective negative terminal capacitor of the plurality of negative terminal capacitors is coupled between the negative input terminal of the comparator and the ground terminal; and
when the output signal of the comparator switches between logic 1 and logic 0 during the two successive cycles, a connection status of the respective positive terminal capacitor and a connection status of the respective negative terminal capacitor are kept.

16. The analog-to-digital conversion method as claimed in claim 13, wherein:
the output signal of the comparator collected during M successive cycles of the plurality of cycles of the search scheme is combined to select between (M+1) capacitor network switching choices for controlling the voltage difference; and
M is an integer number greater than 1.

17. The analog-to-digital conversion method as claimed in claim 16, wherein:
the more logic 1 the comparator outputs during the M successive cycles, the more of the positive terminal capacitors are changed to couple between the positive input terminal of the comparator and a ground terminal; and
the more logic 0 the comparator outputs during the M successive cycles, the more of the negative terminal capacitors are changed to couple between the negative input terminal of the comparator and the ground terminal.

18. The analog-to-digital conversion method as claimed in claim 13, further comprising:
providing a fixed positive terminal capacitor fixed between the positive input terminal of the comparator and a ground terminal; and
providing a fixed negative terminal capacitor fixed between the negative input terminal of the comparator and the ground terminal.

19. A successive approximation register analog-to-digital converter, comprising:
a successive approximation register logic circuit, repeatedly generating digital control bits in a plurality of cycles of a search scheme of the successive approximation register analog-to-digital converter;
a comparator, having a positive input terminal and a negative input terminal, and generating an output signal to be transmitted to the successive approximation register logic circuit for generation of the digital control bits; and
a capacitor network, comprising a plurality of positive terminal capacitors coupled to the positive input terminal of the comparator and a plurality of negative terminal capacitors coupled to the negative input terminal of the comparator, wherein the positive terminal capacitors and the negative terminal capacitors sample an analog input of the successive approximation register analog-to-digital converter in a sampling phase prior to the search scheme and are operated based on the digital control bits in the search scheme to reduce a voltage difference between the positive input terminal and the negative input terminal of the comparator,
wherein:
digital representations of the analog input are approximated in the search scheme and output by the successive approximation register logic circuit; and
the successive approximation register logic circuit combines the output signal of the comparator collected during at least two successive cycles of the plurality of cycles of the search scheme to generate at least three digital representations selecting between at least three capacitor network switching choices for controlling the voltage difference.

20. The successive approximation register analog-to-digital converter as claimed in claim 19, wherein:
when the output signal of the comparator collected during the at least two successive cycles is kept at logic 1, the successive approximation register logic circuit pulls down a voltage level at the positive input terminal of the comparator;
when the output signal of the comparator collected during the at least two successive cycles is kept at logic 0, the successive approximation register logic circuit pulls down a voltage level at the negative input terminal of the comparator; and
when the output signal of the comparator switches between logic 1 and logic 0 during the at least two successive cycles, the successive approximation register logic circuit keeps the voltage levels at the positive input terminal and the negative input terminal of the comparator.

21. The successive approximation register analog-to-digital converter as claimed in claim 19, wherein:
the successive approximation register logic circuit combines the output signal of the comparator collected during M successive cycles of the plurality of cycles of the search scheme to select between (M+1) capacitor network switching choices for controlling the voltage difference; and M is an integer number greater than 1.

22. The successive approximation register analog-to-digital converter as claimed in claim 21, wherein:

the more logic 1 the comparator outputs during the M successive cycles, the deeper the successive approximation register logic circuit pulls down a voltage level at the positive input terminal of the comparator; and the more logic 0 the comparator outputs during the M successive cycles, the deeper the successive approximation register logic circuit pulls down the voltage level at the negative input terminal of the comparator.

23. The successive approximation register analog-to-digital converter as claimed in claim 19, wherein:

during the sampling phase, a positive receiving terminal and a negative receiving terminal of the analog input are coupled to the positive input terminal and the negative input terminal of the comparator, respectively, and the positive terminal capacitors are coupled between a reference terminal that provides a reference voltage level and the positive input terminal and the negative terminal capacitors are coupled between the reference terminal and the negative input terminal.

24. The successive approximation register analog-to-digital converter as claimed in claim 23, wherein:

when the output signal of the comparator collected during the at least two successive cycles is kept at logic 1, the successive approximation register logic circuit couples a respective positive terminal capacitor of the plurality of positive terminal capacitors between the positive input terminal of the comparator and a ground terminal;

when the output signal of the comparator collected during the at least two successive cycles is kept at logic 0, the successive approximation register logic circuit couples a respective negative terminal capacitor of the plurality of negative terminal capacitors between the negative input terminal of the comparator and the ground terminal; and when the output signal of the comparator switches between logic 1 and logic 0 during the at least two successive cycles, the successive approximation register logic circuit keeps a connection status of the respective positive terminal capacitor and a connection status of the respective negative terminal capacitor.

25. The successive approximation register analog-to-digital converter as claimed in claim 23, wherein:

the successive approximation register logic circuit combines the output signal of the comparator collected during two successive cycles of the plurality of cycles of the search scheme to select between three capacitor network switching choices for controlling the voltage difference;

when the output signal of the comparator collected during the two successive cycles is kept at logic 1, the successive approximation register logic circuit couples a respective positive terminal capacitor of the plurality of positive terminal capacitors between the positive input terminal of the comparator and a ground terminal;

when the output signal of the comparator collected during the two successive cycles is kept at logic 0, the successive approximation register logic circuit couples a respective negative terminal capacitor of the plurality of negative terminal capacitors between the negative input terminal of the comparator and the ground terminal; and when the output signal of the comparator switches between logic 1 and logic 0 during the two successive cycles, the successive approximation register logic circuit keeps a connection status of the respective positive terminal capacitor and a connection status of the respective negative terminal capacitor.

26. The successive approximation register analog-to-digital converter as claimed in claim 23, wherein:

the successive approximation register logic circuit combines the output signal of the comparator collected during M successive cycles of the plurality of cycles of the search scheme to select between (M+1) capacitor network switching choices for controlling the voltage difference; and M is an integer number greater than 1.

27. The successive approximation register analog-to-digital converter as claimed in claim 26, wherein:

the more logic 1 the comparator outputs during the M successive cycles, the more of the positive terminal capacitors are changed to couple between the positive input terminal of the comparator and a ground terminal; and the more logic 0 the comparator outputs during the M successive cycles, the more of the negative terminal capacitors are changed to couple between the negative input terminal of the comparator and the ground terminal.

28. The successive approximation register analog-to-digital converter as claimed in claim 23, wherein the capacitor network further comprises:

a fixed positive terminal capacitor, fixed between the positive input terminal of the comparator and a ground terminal; and a fixed negative terminal capacitor, fixed between the negative input terminal of the comparator and the ground terminal.

29. The successive approximation register analog-to-digital converter as claimed in claim 4, wherein:

when the output signal of the comparator collected during the at least two successive cycles is kept at logic 1, the successive approximation register logic circuit pulls down a voltage level at the positive input terminal of the comparator and/or pulls up a voltage level at the negative input terminal of the comparator;

when the output signal of the comparator collected during the at least two successive cycles is kept at logic 0, the successive approximation register logic circuit pulls up the voltage level at the positive input terminal of the comparator and/or pulls down the voltage level at the negative input terminal of the comparator; and when the output signal of the comparator switches between logic 1 and logic 0 during the at least two successive cycles, the successive approximation register logic circuit keeps the voltage difference between the voltage level at the positive input terminal of the comparator and the voltage level the negative input terminal of the comparator unchanged.

30. The analog-to-digital conversion method as claimed in claim 13, wherein: when the output signal of the comparator collected during the at least two successive cycles is kept at logic 1, the successive approximation register logic circuit pulls down a voltage level at the positive input terminal of the comparator and/or pulls up a voltage level at the negative input terminal of the comparator;

when the output signal of the comparator collected during the at least two successive cycles is kept at logic 0, the successive approximation register logic circuit pulls up the voltage level at the positive input terminal of the comparator and/or pulls down the voltage level at the negative input terminal of the comparator; and when the output signal of the comparator switches between logic 1 and logic 0 during the at least two successive cycles, the successive approximation register logic circuit keeps the voltage difference between the voltage level at the positive input terminal of the comparator and the voltage level the negative input terminal of the comparator unchanged.

31. The analog-to-digital conversion method as claimed in claim 13, wherein:

when the output signal of the comparator collected during the at least two successive cycles is kept at logic 1, a respective positive terminal capacitor of the plurality of positive terminal capacitors is coupled between the positive input terminal of the comparator and a ground terminal and/or a respective negative terminal capacitor of the plurality of negative terminal capacitors is coupled between the negative input terminal of the comparator and the reference terminal;

when the output signal of the comparator collected during the at least two successive cycles is kept at logic 0, the respective positive terminal capacitor of the plurality of positive terminal capacitors is coupled between the positive input terminal of the comparator and the reference terminal and/or the respective negative terminal capacitor of the plurality of negative terminal capacitors is coupled between the negative input terminal of the comparator and the ground terminal; and when the output signal of the comparator switches between logic 1 and logic 0 during the at least two successive cycles, a connection status of the respective positive terminal capacitor and a connection status of the respective negative terminal capacitor are kept.

* * * * *